US006187514B1

(12) United States Patent
Kiyosawa et al.

(10) Patent No.: US 6,187,514 B1
(45) Date of Patent: Feb. 13, 2001

(54) METHOD FOR FORMING PAD CHARACTER IN PUSH BUTTON SWITCH AND METHOD FOR MANUFACTURING COVER MEMBER FOR PUSH BUTTON SWITCH

(75) Inventors: Mikio Kiyosawa; Sadao Nakano, both of Nagano; Kinji Kuroiwa, Saitama, all of (JP)

(73) Assignee: Shin-Etsu Polymer Co., Ltd. (JP)

( * ) Notice: Under 35 U.S.C. 154(b), the term of this patent shall be extended for 0 days.

(21) Appl. No.: 09/170,905

(22) Filed: Oct. 13, 1998

(30) Foreign Application Priority Data

Oct. 14, 1997 (JP) .................................................. 9-295020

(51) Int. Cl.[7] ....................................................... G03F 7/00
(52) U.S. Cl. ............................................ 430/320; 430/945
(58) Field of Search ..................................... 430/320, 945

(56) References Cited

U.S. PATENT DOCUMENTS

| | | | | |
|---|---|---|---|---|
| 4,595,647 | | 6/1986 | Spanjer | 430/138 |
| 4,775,574 | * | 10/1988 | Fukushima | 428/209 |
| 5,270,507 | * | 12/1993 | Nakamura | 200/511 |
| 5,422,383 | * | 6/1995 | Takahasi | 523/136 |
| 5,599,869 | | 2/1997 | Kurz | 524/495 |

FOREIGN PATENT DOCUMENTS

| | | |
|---|---|---|
| 195 23 086 A1 | 1/1997 | (DE) . |
| 07169360 | 7/1995 | (JP) . |
| 95/23417 | 8/1995 | (WO) . |

OTHER PUBLICATIONS

Patent Abstracts of Japan, vol. 095, No. 010, Nov. 30, 1995 & JP 07 169360A (Shin Etsu Polymer Co Ltd; Others: 01), Jul. 4, 1995.

* cited by examiner

*Primary Examiner*—Mark F. Huff
*Assistant Examiner*—Nicole Barreca
(74) *Attorney, Agent, or Firm*—Lerner, David, Littenberg, Krumholz & Mentlik, LLP

(57) ABSTRACT

A method for forming a pad character in a key top for a push button switch and a method for manufacturing a cover member for a push button switch capable of permitting a push button switch to be manually operated in a manner comfortable to fingers over an extended period of time while preventing wearing of an indication section and simplifying the manufacturing of the cover member for the push button switch. A pigment particle is coated with a volatilization layer formed of resin blended with an electromagnetic wave absorbing powder to prepare a laser-sensitive color developing agent, which agent is then added to a thermosetting resin or elastomer material to prepare a composition. Each of key tops is formed of the composition, followed by irradiation of a laser beam on each of the key tops to form a character-like or figure-like indication section in the key top.

23 Claims, 3 Drawing Sheets

METHOD FOR FORMING PAD CHARACTER IN PUSH BUTTON SWITCH AND METHOD FOR MANUFACTURING COVER MEMBER FOR PUSH BUTTON SWITCH

BACKGROUND OF THE INVENTION

This invention relates to a method for forming a pad character in a key top for a push button switch which is used for a data input unit for a mobile communication equipment, a switch unit or the like and a method for manufacturing a cover member for a push button switch, and more particularly to a method for irradiating a key top with a laser beam to form an indication such as a character or the like in the key top.

A push button switch for a data input unit for a mobile communication equipment such as a cellular phone, a key board for a personal computer or the like is generally constructed by mounting a cover member directly on a circuit board. In such a push button switch, a substrate which includes a plurality of movable sections is formed of a rubber elastomer. The movable sections are each provided on a front surface thereof with a key top and on a rear surface thereof with a movable contact. The key top is formed on a top surface thereof with a figure, a character or the like by printing, to thereby provide a cover member.

In the cover member thus constructed, the top surface of each of the key tops functions as an operation section or a pressed surface with which a finger of an operator is contacted, when the cover member is mounted on the circuit board to constitute the push button switch. Thus, use of the push button switch for a long period of time causes the figure, character or the like on the top surface of the key top to be worn due to contact with the finger, leading to a deterioration in visibility of the figure or the like.

A cover member intended to improve wear resistance of a character, a figure or the like on a top surface of a key top is proposed in Japanese Patent Application Laid-Open Publication No. 169360/1995. More specifically, the publication discloses a method for manufacturing a cover member wherein a key top is formed on a top surface thereof with a recess of 5 to 50 $\mu$m in depth in any desired design by means of a forming die concurrently with formation of the key top, and then a colored section is formed of an ink of 150 to 400 p (poise) in the recess by screen printing by means of a polyester screen which was subjected to plasma processing so as to have a mesh density of 300 to 500 meshes/inch.

However, the method disclosed in the Japanese publication requires to form the forming die for the key top with fine projections for forming the recess, so that working or machining of the forming die is highly troublesome and durability of the forming die is deteriorated. Also, the method requires formation of the recess and applying of the coloring ink in the recess, to thereby increase the number of steps in the manufacturing, leading to an increase in manufacturing cost. Further, use of the cover member for a prolonged period of time often causes falling-off of the coloring agent or ink from the recess, so that the key top is deteriorated in being comfortable to fingers.

SUMMARY OF THE INVENTION

The present invention has been made in view of the foregoing disadvantages of the prior art.

Accordingly, it is an object of the present invention to provide a method for forming a pad character in a push button switch which is capable of simplifying formation of the pad character.

It is another object of the present invention to provide a method for forming a pad character in a push button switch which is capable of permitting a push button switch to be manually operated in a manner comfortable to fingers over a prolonged period of time while preventing wearing of an indication section.

It is a further object of the present invention to provide a method for manufacturing a cover member for a push button switch which is capable of simplifying the manufacturing.

It is still another object of the present invention to provide a method for manufacturing a cover member for a push button switch which is capable of providing a cover member which is satisfactory to the touch with the fingers over a long period of time while preventing wearing of a display section.

In accordance with one aspect of the present invention, a method for forming a pad character in a push button switch is provided. The method includes the steps of: coating a pigment particle with a volatilization layer made of resin blended with an electromagnetic wave absorbing powder to prepare a laser-sensitive color developing agent; forming a key top of a light-permeable thermosetting resin or elastomer material blended with the laser-sensitive color developing agent; and irradiating the key top with a laser beam to form therein an indication section of the pigment particle.

In accordance with another aspect of the present invention, a method for manufacturing a cover member for a push button switch in which a substrate including a base section and movable sections displaceable with respect to the base section is integrally formed of a rubber composition and the movable sections of the substrate are each securely mounted thereon with a key top is provided. The method includes the steps of: coating a pigment particle with a volatilization layer made of resin blended with an electromagnetic wave absorbing powder to prepare a laser-sensitive color developing agent; forming each of the key tops of a light-permeable thermosetting resin or elastomer material blended with the laser-sensitive color developing agent; irradiating each of the key tops with a laser beam to form therein an indication section of the pigment particle; and fixing each of the key tops formed with the indication to a respective one of the movable sections integrally.

Also, in accordance with this aspect of the present invention, a method for manufacturing a cover member for a push button switch in which a substrate including a base section and movable sections displaceable with respect to the base section is integrally formed of a rubber composition and the movable sections of the substrate are each securely mounted thereon with a key top is provided. The method includes the steps of: coating a pigment particle with a volatilization layer made of resin blended with an electromagnetic wave absorbing powder to prepare a laser-sensitive color developing agent; forming a light-permeable thermosetting resin or elastomer material blended with the laser-sensitive color developing agent into each of the key tops; fixing each of the key tops to a respective one of the movable sections integrally; and irradiating each of the key tops fixed on the substrate with a laser beam to form therein an indication section of the pigment particle.

In a preferred embodiment of the present invention, the fixing is carried out by die-forming a rubber elastomer into the substrate while using each of the key tops as an insert.

In a preferred embodiment of the present invention, the fixing is carried out by adhering each of the key tops to a front surface of a respective one of the movable sections of the substrate.

In a preferred embodiment of the present invention, the pigment particle has a particle diameter of 30 to 50 μm.

In a preferred embodiment of the present invention, the electromagnetic wave absorbing powder has a particle diameter equal to or smaller than a wavelength of the laser beam.

The present invention constructed as described above may be realized in the form of a push button switch typically incorporated in a data input unit of a cellular phone or a keyboard of a personal computer, irrespective of whether it is of either the illumination type or the non-illumination type. In such a push button switch, each of the key tops is urged by means of a mechanical elastic member such as a coiled spring, a leaf spring or the like and combined with the substrate made of a rubber elastomer to constitute the cover member.

The substrate has the key tops made of the thermosetting resin or elastomer material and fixed to the respective movable sections thereof as described above and is mounted directly or through a click plate or the like on a circuit board provided thereon with fixed contacts, to thereby constitute the push button switch. The substrate is provided on a rear surface of each of the movable sections thereof with a movable contact or press element. The press element may be formed integrally with the substrate or attached thereto by means of an adhesive. The circuit board may be provided thereon with the fixed contacts described above, light emitting elements such as LEDs and the like and the click plate may be formed with a coned disc spring-like element such as a dome-like section exhibiting elastic deformation properties in correspondence to the movable section of the substrate. In the push button switch thus constructed, displacement of each of the movable sections permits the movable contact to be brought into direct contact with the fixed contacts on the circuit board or the press element to pressedly force the dome section of the click plate, so that a contact arranged on a rear surface of the dome section may be brought into contact with the fixed contacts, to thereby operate a circuit.

The substrate may be formed of the rubber composition as described above. The rubber compositions include a synthetic rubber material such as urethane rubber, acrylic rubber, butyl rubber, silicone rubber, isoprene rubber, ethylene-propylenediene terpolymer or the like; a natural rubber material; a thermosetting elastomer; a polyester or urethane thermoplastic elastomer; and the like. When the push button switch is of the illumination type, the rubber composition may be light-permeable. The substrate may be formed either solely by compression molding, injection molding or the like or using each of the key tops as an insert by insert molding. When the push button switch is of the illumination type, the substrate may be formed on a portion of a front surface thereof other than at least a part of the movable sections with a light-blocking layer. The light-blocking layer may be formed by spray coating or the like after the movable section is covered with a masking tape or the like. Alternatively, it may be formed by depositing the light-blocking layer all over the front surface of the substrate by spray coating and then removing portions of the light-blocking layer located on the movable sections therefrom by irradiation of the laser beam or the like.

The key tops may each be formed to have any suitable shape corresponding to the movable section of the substrate, such as a block-like shape like a column, a sheet-like shape, a shape like a cap or hollow cylinder closed at one end thereof, or the like. The key top, when it is formed to have a block-like or sheet-like shape, is fixed onto the front surface of the movable section. When it is formed to have a cap-like shape, it may be fixedly fitted on the movable section. The key top may be formed of a composition prepared by blending the thermosetting resin material such as melamine resin, epoxy resin, urea resin, polyester resin, polyurethane resin or the like or the thermosetting elastomer material with the laser-sensitive color developing agent by injection molding or the like.

The key tops may each be fixed onto the substrate by means of an adhesive after formation thereof or integrally fixed onto the substrate during formation of the substrate while being placed as an insert in a forming die for the substrate. Also, the key top is irradiated with the laser beam before or after fixing thereof onto the substrate, so that the indication section such as a character, a symbol, a figure or the like may be made of the laser-sensitive color developing agent and formed within the key top.

The laser-sensitive color developing agent is constituted by the colored pigment particle coated with the volatilization layer formed of the resin blended with the electromagnetic wave absorbing powder as described above. The laser-sensitive color developing agent is added to the thermosetting resin or elastomer material for the key top in an amount of 0.005 to 5.0 parts by weight, preferably 0.01 to 1.00 part by weight, and more preferably 0.02 to 0.35 by weight based on 100 parts by weight of the thermosetting resin or elastomer material. The colored pigment particle has an average particle diameter equal to or larger than a wavelength of visible light or light of a color to be developed. Preferably, it has an average particle diameter of about 30 to 50 μm. An agglutinated particle of any suitable pigment such as titanium dioxide or the like may be used as the colored pigment particle. Desirably an inorganic pigment increased in heat resistance may be used for this purpose.

The volatilization layer consisting of a resin binder of a thickness of about 0.5 to 1.5 μm and the electromagnetic wave absorbing powder covers or coats the pigment particle and is volatilized in the form of gas of a low molecular weight due to irradiation of the laser beam thereon. The electromagnetic wave absorbing powder is constituted by a powder capable of absorbing an electromagnetic wave. The electromagnetic wave absorbing powder may be made of, for example, a carbon particle such as acetylene black, Ketjen black or the like, a metal oxide such as Mn-Zn ferrite or ferrite of iron oxide of, particularly, a black color, a dark brown color or the like, a powder of a high-dielectric material increased in dipole moment such as barium titanate, or the like. The electromagnetic wave absorbing powder has an average particle diameter three times as large as a wavelength of the laser beam or less, preferably equal to or smaller than the wavelength, and more preferably of ⅓ to ½ of the wavelength. Only one of the above-described powders and any combination thereof may be used as the electromagnetic wave absorbing powder. The electromagnetic wave absorbing powder is added to the resin binder in an amount of about 0.005 to 5.0 parts by weight based on 100 parts by weight of the resin binder and desirably about 0.01 to 1.00 part by weight based thereon. The resin binders may include polyvinyl alcohol and the like.

The laser beam may be obtained using any well-known laser such as a YAG laser, an excimer laser, a ruby laser or the like, which may be scanned depending on the character of the indication section or the like. Alternatively, irradiation of the laser beam may be carried out through any mask. Energy of the laser beam may be suitably selected depending on a depth of the indication section.

Thus, in the present invention, the key tops are each formed of the resin or elastomer composition which is a blend of the thermosetting resin or elastomer material and the laser-sensitive light developing agent constituted by the pigment particle coated with the volatilization layer and then irradiated with the laser beam to form the indication section such as a character, a symbol or the like within the key top. Thus, the key top is reduced in manufacturing cost while keeping the indication section from being worn and ensuring being comfortable to fingers. More specifically, irradiation of the key top with the laser beam causes the volatilization layer formed of the electromagnetic wave absorbing powder and resin binder to be reduced in molecular weight, to thereby be volatilized in the form of gas, so that the pigment particle may be exposed. This leads to formation of the indication section which is substantially free of wearing and comfortable to fingers.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENT

Now, the present invention will be described with reference to the accompanying drawings.

Figure 1:
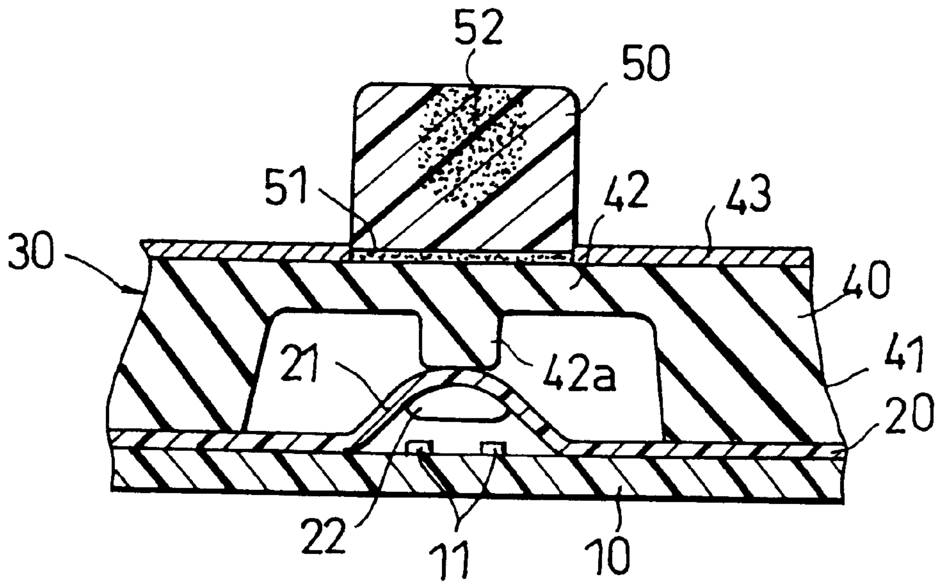
FIG. 1 is a fragmentary sectional view showing an essential part of a push button switch including a cover member manufactured by an embodiment of a method for manufacturing a cover member for a push button switch according to the present invention.

Referring first to FIG. 1, a cover member for a push button switch manufactured by an embodiment of a method for manufacturing a cover member for a push button switch according to the present invention is illustrated. In FIG. 1, the cover member is shown while being incorporated in a push button switch. In FIG. 1, reference numeral 10 designates a circuit board, 20 is a click plate and 30 is the cover member. The circuit board 10 is made of epoxy resin or the like as well known in the art and provided on a front surface thereof with fixed contacts 11 and light emitters (not shown) such as LEDs or the like. The click plate 20 includes a plurality of dome sections 21 constructed so as to exhibit elastic deformation properties. The dome sections 21 are each so formed that a front surface thereof is outwardly expanded in correspondence to a respective one of movable sections of the cover member 30 described hereinafter. The dome sections 21 are each provided on a rear surface thereof with a movable contact 22. The dome sections 21 are each pressedly abutted at a top of the front surface thereof against a corresponding one of press sections 42*a* of the cover member 30, which will be described hereinafter, so that the press sections 42*a* of the cover member 30 may each forcedly press the dome section 21 to deform the corresponding dome section 21, to thereby bring the movable contact 22 into contact with the fixed contacts 11.

The cover member 30 includes a substrate 40 made of a light-permeable silicone rubber material and a plurality of key tops 50 made of a light-permeable hard thermosetting resin material. The substrate 40 includes a base section 41 acting as a support through which the substrate 40 is supported on the circuit board 10 and a plurality of thin-wall sections or movable sections 42 formed on the base section 41 in a predetermined array and in a manner to be integral with the base section 41. The substrate 40 is formed on a portion of a front surface thereof except a central portion of each of the thin-wall sections 42 or a portion thereof on which a corresponding one of the key tops 50 is mounted with a light-blocking colored layer 43. The thin-wall sections 42 each have an area as viewed in plan formed so as to be similar to and larger than that of a corresponding one of the key tops 50 as viewed in plan. Also, the thin-wall sections 42 each have a flat front surface formed so as to be contiguous to a front surface of the base section 41. Further, the thin-wall sections 42 are each provided on a central portion of a rear surface thereof with the press section 42*a* briefly described above in a manner to be downwardly projected therefrom so as to pressedly force a corresponding one of the dome sections 21. In addition, the thin-wall sections 42 are each fixedly mounted on the front surface thereof with a respective one of the key tops 50. The light-blocking colored layer 43 may be made of a paint or ink prepared by mixing resin for a binder with a light-blocking pigment such as carbon black or the like and formed to have a thickness of about 50 $\mu$m by spraying, printing or the like.

The key tops 50 are each formed to have a substantially cylindrical shape and firmly adhered on a rear surface thereof to the front surface of a corresponding one of the thin-wall sections 42 of the substrate 40 by means of an adhesive 51. The key top 50 is formed therein with an indication section 52 such as a letter or character, a symbol, a figure, or the like. In FIG. 1, the indication section 52 is indicated at dots. The key top 50 is formed of a light-permeable thermosetting resin composition prepared by blending thermosetting resin with a laser-sensitive color developing agent by injection molding or the like, wherein the indication section 52 is formed by locally irradiating the resin composition with a laser beam. The thermosetting resin composition may be prepared by 100 parts by weight of thermosetting resin such as melamine resin, polyester resin or the like with 0.02 to 0.35 part by weight of the laser-sensitive color developing agent by way of example.

Figure 2:
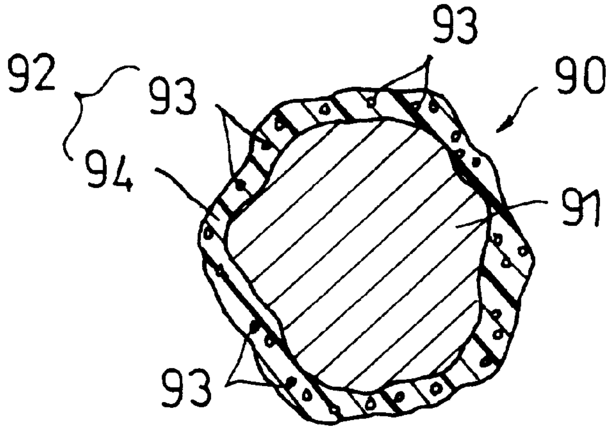
FIG. 2 is a schematic sectional view showing a laser-sensitive color developing agent incorporated in a thermosetting resin composition used in a method for manufacturing a cover member for a push button switch according to the present invention.

The laser-sensitive color developing agent 90, as shown in FIG. 2, may be prepared by coating a pigment particle 91 with a volatilization layer 92. The pigment particle 91 may be constituted by an inorganic pigment having an average particle diameter equal to or larger than a wavelength of visible light and desirably between 30 $\mu$m and 50 $\mu$m. The volatilization layer 92 may be made of a composition prepared by mixing a resin binder such as polyvinyl alcohol or the like in an amount of 100 parts by weight with an electromagnetic wave absorbing powder in an amount of 0.005 to 5.0 parts by weight, for example, 3 parts by weight and so formed that the resin binder 94 has a thickness of, for example, about 1.0 $\mu$m. The electromagnetic wave absorbing powder 93 may be constituted by any suitable material such as acetylene black, black, Ketjen black or the like which has an average particle diameter equal to or smaller than a wavelength of the laser beam and desirably about one third to one half as large as the wavelength, for example an average particle diameter of 0.35 to 10 $\mu$m. In the volatilization layer 92, the electro-magnetic wave absorbing powder 93 may have portions thereof which outwardly protrude from a surface of the resin binder 94.

Now, manufacturing of the cover member 30 will be described hereinafter with reference to FIGS. 3A to 3E.

Figure 3A:
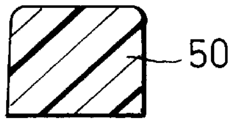
FIGS. 3A to 3E are schematic views each showing a respective one of steps in a method for manufacturing a cover member for a push button switch according to the present invention.
Figure 3B:
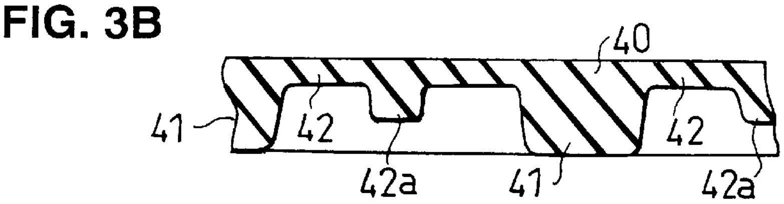

First, the laser-sensitive color developing agent 90 (FIG. 2) is added to the thermosetting resin while mixing, to thereby prepare the thermosetting resin composition, which is then subjected to injection molding, resulting in the key top 50 being provided as shown in FIG. 3A. The laser-sensitive color developing agent 90 is added to the thermosetting resin in an amount of 0.02 to 0.35 part by weight based on 100 parts by weight of the thermosetting resin.

Figure 3C:
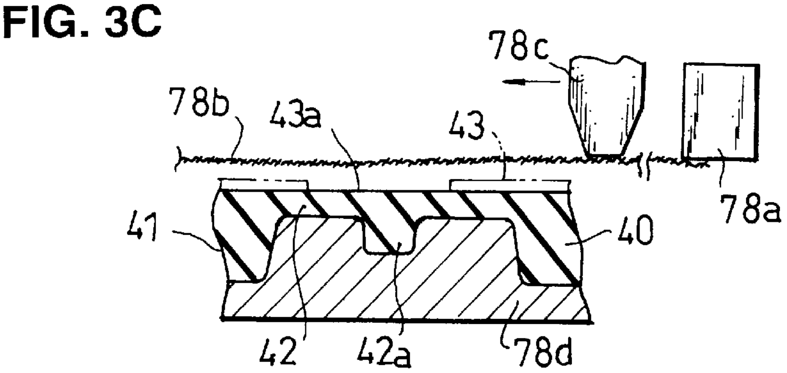

Then, the light-permeable substrate 40 is made of a silicone rubber composition or the like by injection molding, compression molding or the like while ensuring that the base section 41, thin-wall sections 42 and the like are formed integrally with each other. Thereafter, as shown in FIG. 3C, the substrate 40 is securely held by a positioning fixture 78*d* and then the light-blocking colored layer 43 is formed on the front surface of the substrate 40 except an adhesion portion 43*a* which is the central portion of each of the thin-wall sections 42 by means of a suitable screen printing machine well known in the art and more specifically by means of a screen 78*b* stretchedly arranged on a frame 78*a* and a squeegee 78*c*. The light-blocking colored layer 43 may be formed of an ink blended with carbon black or the like so as to exhibit increased light-blocking properties.

The adhesion portion 43*a* may be formed thereon with a light-permeable colored layer before or after formation of the light-blocking colored layer 43.

Figure 3D:
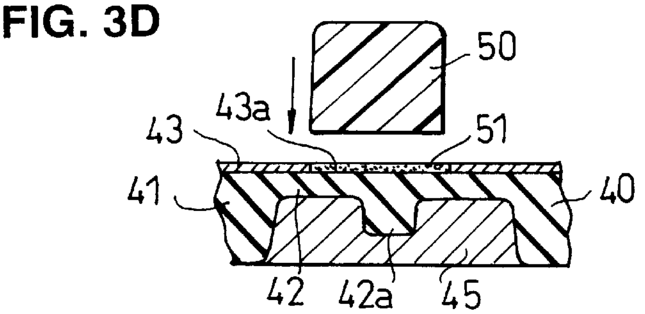
Figure 3E:
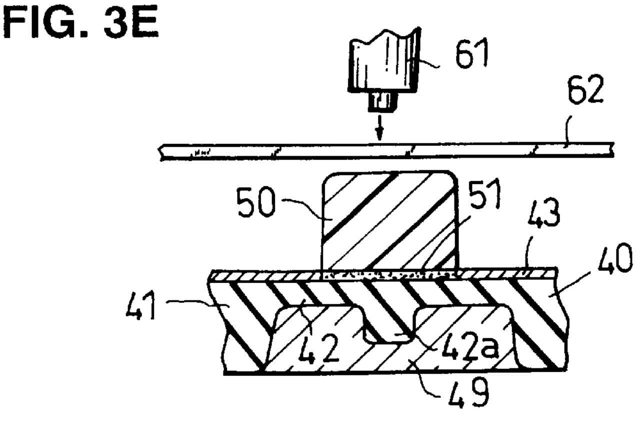

Subsequently, as shown in FIG. 3D, the substrate 40 thus formed thereon with the light-blocking colored layer 43 is fixed on a fixture 45 and then the front surface of each of the thin-wall sections 42 of the substrate 40 or each of the adhesion portions 43*a* is coated thereon with an adhesive 51 to adhesively mount the key top 50 thereon. Then, the substrate 40 is placed in a drying oven or the like to dry and cure the adhesive 51, so that the key top 50 may be securely fixed onto the substrate 40. In this instance, the adhesion portion 43*a* of the substrate 40 is subjected to either a treatment using a coupling agent or ultraviolet or plasma irradiation as required.

Thereafter, the key tops 50 are each irradiated on a top surface thereof with a laser beam from a laser 61 through a mask 62 while securely holding the substrate 40 which has the key tops 50 fixed thereon on a positioning fixture 49, so that the indication section 52 may be formed within each of the key tops 50. More specifically, the laser beam irradiated intrudes into the key top 50 by a depth corresponding to energy thereof, so that the laser-sensitive color developing agent 90 is exposed at a portion thereof corresponding to the depth to the laser beam. This results in the volatilization layer 92 on the exposed portion of the laser-sensitive color developing agent 90 being destroyed to expose the pigment particle 91, so that the indication section 52 may develop a color of the pigment particle 91 as shown in FIGS. 1 and 2.

The substrate 40 including the key tops 50 each formed therein with the indication section 52 or the finished cover member 30 is mounted on the circuit board 10 together with the click plate 20 and the like, resulting in the push button switch being assembled as shown in FIGS. 1 and 4*a*–4*c*. As well known in the art, the push button switch thus assembled is incorporated in a casing of a cellular phone or the like while keeping the key tops 50 outwardly projected at distal ends thereof from the casing.

In the thus-manufactured cover member 30 and therefore push button switch, the key tops 50 are each made of hard thermosetting resin and the indication section 52 is formed within each of the key tops 50 without forming any ruggedness on the surface of the key top 50. This permits the key top 50 to be manually operated in a manner comfortable to fingers and exhibit increased durability while preventing wearing of the indication section 52.

In the illustrated embodiment, as described above, the key tops 50 are each irradiated with the laser beam after they are fixed onto the substrate 40. Alternatively, the irradiation may be carried out prior to fixing of the key top 50 onto the substrate 40, resulting in forming the indication section 52 and then the key top 50 thus formed therein with the indication section 52 may be mounted on the thin-wall section 42 of the substrate 40. Also, mounting of the key top 50 on the substrate 40 may be carried out by insert molding wherein formation of the substrate 40 is carried out while placing the key top 50 in a forming die for the substrate 40, irrespective of before or after formation of the indication section 52.

Figure 4A:
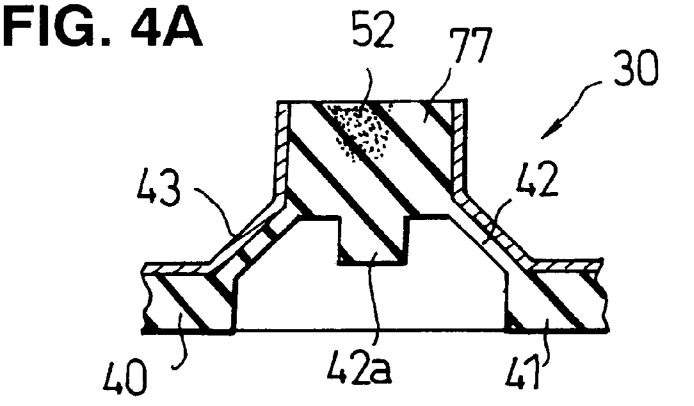
FIGS. 4A to 4C are fragmentary sectional views each showing a respective one of modifications of a cover member for a push button switch manufactured by a method for manufacturing a cover member for a push button switch according to the present invention.
Figure 4B:
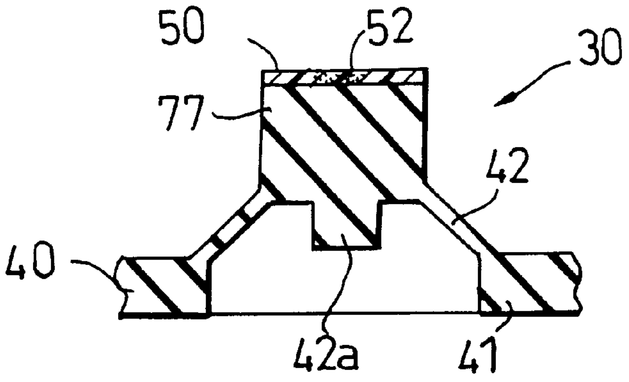
Figure 4C:
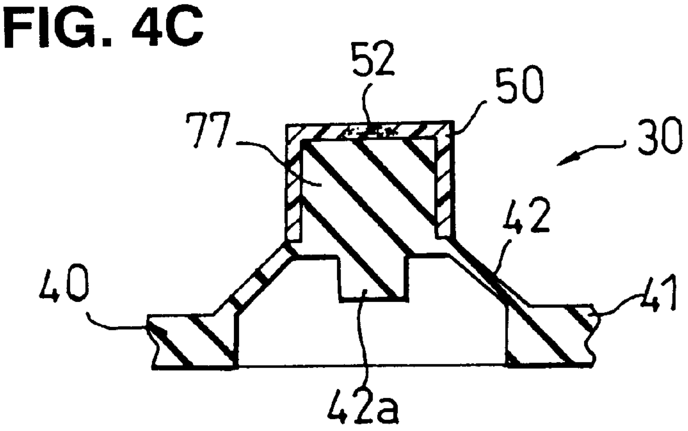

The present invention may be applied to a cover member shown in each of FIGS. 4A to 4C as well. More particularly, a cover member 30 shown in FIG. 4A includes a substrate 40 made of a rubber elastomer composition such as silicone rubber blended with a laser-sensitive color developing agent 90 (not shown) and including a base section 41 and key top portions 77 of a column-like shape each connected through a thin-wall section 42 to the base section 41. Then, the key top portions 77 of the substrate 40 are each irradiated on a top surface thereof with a laser beam to form an indication section 52 in the key top portion 77.

A cover member 30 shown in FIG. 4B is so constructed that a substrate 40 is made of a silicone rubber composition free of any laser-sensitive color developing agent and plate-like key tops 50 are each formed of a composition containing a thermosetting resin or elastomer material and a laser-sensitive color developing agent 90 blended with each other. Then, the plate-like key tops 50 are each irradiated with a laser beam to form an indication section 52 within the plate-like key top 50 and then fixedly mounted on a top surface of a corresponding one of key top portions 77 of a substrate 40. Alternatively, the plate-like key tops 50 are each fixed on the top surface of a corresponding one of the key top portions 77 and then irradiated with a laser beam to form the indication section 52 within the plate-like key top 50.

In a cover member 30 shown in FIG. 4C, key tops 50 which are formed to have a cap-like shape are each fitted on a corresponding one of key top portions 77 of a substrate 40 and adhered thereto. The cap-like key tops 50 are each formed of a composition containing a thermosetting resin or elastomer material and a laser-sensitive color developing agent 90 (not shown) blended with each other. The cap-like key top 50 is irradiated with a laser beam to form an indication section 52 therein before or after fixing of the key top 50 onto the key top portion 77 of the substrate 40.

As can be seen from the foregoing, the present invention is so constructed that the pigment particle is coated with the volatilization layer made of the resin blended with the electromagnetic wave absorbing powder to prepare the laser-sensitive color developing agent, which is then added to the thermosetting resin or elastomer material to prepare the composition, the key tops being formed of the composition, followed by irradiation of each of the key tops with the laser beam to form the character-like or figure-like indication section in the key top. Such construction simplifies manufacturing of the cover member and permits the thus-provided cover member to be manually operated in a manner comfortable to fingers. Also, it effectively prevents wearing of the indication section to ensure durability of the cover member.

The invention will be understood more readily with reference to the following examples, however, these examples are intended to illustrate the invention and are not to be construed to limit the scope of the invention.

EXAMPLE 1

5 parts by weight of titanium oxide of 30 to 50 $\mu$m in particle diameter sold under a tradename "Plastron Supra White A-112" by DIC and 3 parts by weight of acetylene black of 1 to 10 $\mu$m sold under a tradename "Plastron Supra Black A-3377" by DIC were added to an aqueous solution containing 100 parts by weight of polyvinyl alcohol and subjected to kneading using a homomixer to prepare a kneaded material. Then, the kneaded material was dried in a dryer at 150° C. for 30 minutes and then disintegrated to obtain dried particles, which were subjected to sieving, resulting in laser-sensitive color developing particles of 31 to 70 $\mu$m in particle diameter being obtained. The thus-obtained laser-sensitive color developing particles were each formed thereon with a volatilization layer consisting of a resin binder of 0.5 $\mu$m in average thickness containing an electromagnetic wave absorbing powder to obtain a laser-sensitive color developing agent.

0.2 part by weight of the thus-obtained laser-sensitive color developing agent was added to 100 parts by weight of methyl phenyl silicone resin while mixing, to thereby prepare a thermosetting resin composition, which was then formed into key tops by compression molding. The key tops thus obtained had an column-like shape and dimensions of 5 mm in diameter and 3 mm in height. The key tops were each fixedly held on a positioning fixture and irradiated with a laser beam under the following conditions:

Laser:YAG laser (sold under a tradename "MY-9500" by Kabushiki Kaisha KEYENCE)

Wavelength: 1.06 $\mu$m

Output: 50 W

Manner of formation of character or the like: Scanning

The irradiation permitted each of the key tops to be formed therein with a white developing character clearly observed from above the key top. An indication section formed with the character had a depth of 0.05 to 0.1 mm from a top surface of the key top.

EXAMPLE 2

A laser-sensitive color developing agent was prepared by substantially repeating the procedure described in Example 1. 0.05 part by weight of the thus-prepared laser-sensitive color developing agent was added to 100 parts by weight of polyester urethane sold under a tradename "Quinnate RE-60" by Nippon Zeon Co., Ltd., which was then formed into key tops by casting. The key tops thus obtained had a column-like shape and dimensions of 5 mm in diameter and 5 mm in height. The key tops were each fixedly held on a positioning fixture and irradiated with a laser beam under the following conditions:

Laser: YAG laser (sold under a tradename "LAY 729EA" by Kabushiki Kaisha TOSHIBA)

Wavelength: 1.06 $\mu$m

Output: 100 W

Manner of formation of character or the like: Scanning

The irradiation permitted each of the key tops to be formed therein with a grayish-white developing character clearly observed from above the key top.

EXAMPLE 3

Example 1 was substantially repeated to obtain key tops except that a silicone rubber composition sold under a tradename "KE-97/TU" by Shin-Etsu Chemical Co., Ltd. was used. The key tops thus obtained were each used as an insert to form a substrate including a base section and thin-wall sections formed integrally with each other by insert molding, resulting in a cover member being provided.

EXAMPLE 4

Example 1 was substantially repeated except that irradiation of a laser beam did not take place, to thereby obtain key tops. Then, Example 3 was substantially repeated using a silicone elastomer material sold under a tradename "DY32-6D1Y" by TORAY SILICONE, INC. and using each of the key tops as an insert, to thereby provide a cover member including a substrate integrally formed with the key tops.

The thus-obtained cover member was fixedly held on a positioning fixture and irradiated with a laser beam under the same conditions as in Example 1.

The irradiation permitted the key tops to be formed therein with a light-white developing character clearly observed from above the key top.

While a preferred embodiment of the present invention has been described with a certain degree of particularity with reference to the accompanying drawings, obvious modifications and variations are possible in light of the above teachings. It is therefore to be understood that within the scope of the appended claims, the invention may be practiced otherwise than as specifically described.

What is claimed is:

1. A method for forming an indication section in a push button, comprising the steps of:

providing a laser-sensitive color developing agent including a pigment particle coated with a volatilization layer made of resin blended with an electromagnetic wave absorbing powder;

forming a key top of a light-permeable thermosetting resin or elastomer material blended with said laser-sensitive color developing agent; and irradiating said key top with a laser beam thereby selectively destroying said volatilization layer of said pigment particle thereby exposing said pigment particles to form an indication section.

2. A method as defined in claim 1, wherein said pigment particle has a particle diameter of 30 to 50 $\mu$m.

3. A method as defined in claim 1, wherein said electromagnetic wave absorbing powder has a particle diameter equal to or smaller than a wavelength of said laser beam.

4. A method for manufacturing a cover member for a push button in which a substrate including a base section and at least one movable sections displaceable with respect to said base section said at least one movable section of said substrate are each securely mounted thereon with a key top, comprising the steps of:

providing a laser-sensitive color developing agent including a pigment particle coated with a volatilization layer made of resin blended with an electromagnetic wave absorbing powder;

forming a key top of a light-permeable thermosetting resin or elastomer material blended with said laser-sensitive color developing agent; and irradiating said key top with a laser beam thereby selectively destroying said volatilization layer of the pigment particle thereby exposing the pigment particles to form an indication section; and affixing said key top formed with said indication section to at least one of said at least one movable section.

5. A method as defined in claim 4, wherein said affixing step is carried out by forming a substrate so as to engage and fix at least a portion of said key top thereon.

6. A method as defined in claim 5, wherein said pigment particle has a particle diameter of 30 to 50 $\mu$m.

7. A method as defined in claim 5, wherein said electromagnetic wave absorbing powder has a particle diameter equal to or smaller than a wavelength of said laser beam.

8. A method as defined in claim 4, wherein said affixing step is carried out by adhering said key top formed with said indication section to a front surface of at least one section of said at least one movable section.

9. A method as defined in claim 8, wherein said pigment particle has a particle diameter of 30 to 50 $\mu$m.

10. A method as defined in claim 8, wherein said electromagnetic wave absorbing powder has a particle diameter equal to or smaller than a wavelength of said laser beam.

11. A method as defined in claim 4, wherein said pigment particle has a particle diameter of 30 to 50 $\mu$m.

12. A method as defined in claim 4, wherein said electromagnetic wave absorbing powder has a particle diameter equal to or smaller than a wavelength of said laser beam.

13. A method for manufacturing a cover member in which a substrate including a base section and at least one movable section displaceable with respect to said base section and said at least one movable section of said substrate is each securely mounted thereon with a key top, comprising the steps of:

providing a laser-sensitive color developing agent including a pigment particle coated with a volatilization layer made of resin blended with an electromagnetic wave absorbing powder;

forming a key top of a light-permeable thermosetting resin or elastomer material blended with said laser-sensitive color developing agent;

affixing said key top formed with said indication section to at least one of said at least one movable section; and irradiating said key top with a laser beam thereby selectively destroying said volatilization layer of said pigment particle thereby exposing said pigment particles to form an indication section.

14. A method defined in claim 13, wherein said affixing step is carried out by forming a substrate so as to engage and fix at least a portion of said key top thereto.

15. A method as defined in claim 14, wherein said pigment particle has a particle diameter of 30 to 50 $\mu$m.

16. A method as defined in claim 14, wherein said electromagnetic wave absorbing powder has a particle diameter equal to or smaller than a wavelength of said laser beam.

17. A method defined in claim 13, wherein said affixing step is carried out by adhering said key top to a front surface of at least one of said at least one movable section of said substrate.

18. A method as defined in claim 17, wherein said pigment particle has a particle diameter of 30 to 50 $\mu$m.

19. A method as defined in claim 17, wherein said electromagnetic wave absorbing powder has a particle diameter equal to or smaller than a wavelength of said laser beam.

20. A method as defined in claim 13, wherein said pigment particle has a particle diameter of 30 to 50 $\mu$m.

21. A method as defined in claim 13, wherein said electromagnetic wave absorbing powder has a particle diameter equal to or smaller than a wavelength of said laser beam.

22. A method of making a laser-sensitive color developing agent comprising:

providing a pigment particle;

coating said pigment particle with a volatization layer including an electromagnetic wave absorbing power and a resin.

23. A laser-sensitive color developing agent comprising a pigment particle coated with a volatilization layer including a resin blended with an electromagnetic wave absorbing powder.

* * * * *